United States Patent
Ting et al.

(10) Patent No.: US 12,477,948 B2
(45) Date of Patent: Nov. 18, 2025

(54) MICRO BLOWER

(71) Applicant: CHUNG-YUAN CHRISTIAN UNIVERSITY, Chung Li (TW)

(72) Inventors: Yung Ting, Chung Li (TW); Sheuan-Perng Lin, Chung Li (TW); Chih-Hsuan Yu, Chung Li (TW); Reno Pangestu, Chung Li (TW)

(73) Assignee: CHUNG-YUAN CHRISTIAN UNIVERSITY, Chung Li (TW)

( * ) Notice: Subject to any disclaimer, the term of this patent is extended or adjusted under 35 U.S.C. 154(b) by 413 days.

(21) Appl. No.: 18/209,066

(22) Filed: Jun. 13, 2023

(65) Prior Publication Data

US 2023/0413677 A1 Dec. 21, 2023

(30) Foreign Application Priority Data

Jun. 21, 2022 (TW) ................................. 111123045

(51) Int. Cl.
*H05K 7/20* (2006.01)
*H10N 30/20* (2023.01)
*H10N 30/80* (2023.01)

(52) U.S. Cl.
CPC ..... *H10N 30/2047* (2023.02); *H05K 7/20563* (2013.01); *H10N 30/802* (2023.02)

(58) Field of Classification Search
CPC .......... H10N 30/2047; H10N 30/802; F04B 43/046; H05K 7/20563; H05K 7/20727; H05K 7/20909; H05K 7/20972
See application file for complete search history.

(56) References Cited

U.S. PATENT DOCUMENTS

| | | | |
|---|---|---|---|
| 11,306,711 B2 * | 4/2022 | Ting | ................ F04B 49/06 |
| 2008/0170951 A1 * | 7/2008 | Satoh | .............. F04B 43/046 |
| | | | 310/357 |
| 2009/0232683 A1 * | 9/2009 | Hirata | .............. F04B 45/047 |
| | | | 417/413.2 |
| 2016/0090978 A1 * | 3/2016 | Kim | ................ F04B 53/08 |
| | | | 165/104.34 |
| 2019/0309744 A1 * | 10/2019 | Ting | ............... F04B 45/047 |

* cited by examiner

*Primary Examiner* — Jacob R Crum
(74) *Attorney, Agent, or Firm* — MUNCY, GEISSLER, OLDS & LOWE, P.C.

(57) ABSTRACT

A micro blower includes a base metal sheet, a flowing channel layer, a sandwich metal sheet, a capping layer and two first piezoelectric vibrators. The flowing channel layer is connected to the top of the base metal sheet and includes a first chamber, a second chamber, an inlet channel, a linking channel and an outlet channel. The inlet channel links to the first chamber and includes an inlet channel inlet size and an inlet channel outlet size, and the inlet channel inlet size is smaller than the inlet channel outlet size. The linking channel links to the first chamber and the second chamber and includes a linking channel inlet size and a linking channel outlet size, and the linking channel inlet size is smaller than the linking channel outlet size.

12 Claims, 8 Drawing Sheets

MICRO BLOWER

BACKGROUND OF THE INVENTION

Field of the Invention

The present invention relates to a micro blower, and more particularly to a micro blower having a good blower cooling effect.

Description of the Prior Art

In a conventional system heat dissipation solution mode, heat generated by a high-heating electronic element (for example, a central processing unit or a graphics processing unit) is first guided to a cooling fin or a metal block having high heat transfer characteristics, and then conducted to a heat dissipation device (for example, a fan or a cooling fin) by means of a heat pipe effect so as to discharge the heat. However, such conventional means contains certain blind spots. For example, when heat energy is to be discharged through these components, the conduction process is a collaboration of multiple components, such that the overall thermal resistance is increased. Moreover, since these heat dissipation devices are assembled from multiple components, assembly and material costs are also increased. In addition, conventional cooling fins are mostly made of aluminum alloy, of which thermal conductivity is considered to be merely at an intermediate level. For the increasingly higher heat generation powers of current elements, such conventional cooling fins made of aluminum alloy are unsuitable for common electronic products such as tablet computers or smartphones having high-power densities.

Moreover, conventional heat pipes are gradually faced with bottlenecks in terms of cooling central processing units of laptop computers. New-generation heat dissipation modules dissipate heat of electronic components by means of heat convection using air as a medium. However, due to fining and slimming of electronic components, channels that are already narrow need to be further minimized in a way that a severe pressure drop is resulted. The narrow channels also seriously affect the exhaust air volume and exhaust air speed, leading to poor cooling effects as well as compromised feasibility.

Therefore, there is a need for a novel and thinned cooling system applicable to portable electronic apparatuses so as to solve the problems above.

SUMMARY OF THE INVENTION

It is a primary object of the present invention to provide a micro blower having a good blower cooling effect.

To achieve the above object, a micro blower of the present invention is used for a heat generating element. The micro blower includes a base metal sheet, a flowing channel layer, a sandwich metal sheet, a capping layer and two first piezoelectric vibrators. The flowing channel layer is connected to the top of the base metal sheet, and includes a first chamber, a second chamber, an inlet channel, a linking channel and an outlet channel. The inlet channel links to the first chamber and includes an inlet channel inlet size and an inlet channel outlet size, and the inlet channel inlet size is smaller than the inlet channel outlet size. The linking channel links to the first chamber and the second chamber, and includes a linking channel inlet size and a linking channel outlet size, and the linking channel inlet size is smaller than the linking channel outlet size. The outlet channel links to the second chamber and includes an outlet channel inlet size and an outlet channel outlet size, and the outlet channel inlet size is smaller than the outlet channel outlet size. The sandwich metal sheet is connected to a top of the flowing channel layer. The capping layer is connected to the top of the sandwich metal sheet and includes two accommodating regions, wherein the two accommodating regions are located above the first chamber and the second chamber, respectively. The two first piezoelectric vibrators are located on the tops and placed in the centers of the two accommodating regions, and are bonded over the sandwich metal sheet. When the two first piezoelectric vibrators are driven, each of first piezoelectric ceramic vibrators vibrates along a vibration direction, so as to change volumes of the first chamber and the second chamber to thereby generate an air flow.

According to an embodiment of the present invention, a first ratio is present between the inlet channel outlet size and the inlet channel inlet size, and is between 1.5 and 2.0.

According to an embodiment of the present invention, a second ratio is present between the linking channel outlet size and the linking channel inlet size, and is between 1.5 and 2.0.

According to an embodiment of the present invention, a third ratio is present between the outlet channel outlet size and the outlet channel inlet size, and ranges between 1.5 and 2.0.

According to an embodiment of the present invention, each of the two first piezoelectric vibrators includes a first piezoelectric ceramic vibrator and a first linking sheet. The first piezoelectric ceramic vibrator covers the first linking sheet. The first linking sheet is bonded to the sandwich metal sheet exposed from the accommodating region.

According to an embodiment of the present invention, the micro blower further includes two second piezoelectric vibrators, which are connected to the bottom of the base metal layer and are aligned with the first chamber and the second chamber, respectively.

According to an embodiment of the present invention, each of the two second piezoelectric vibrators includes a second piezoelectric ceramic vibrator and a second linking sheet. The second piezoelectric ceramic vibrator covers the second linking sheet. The two second linking sheets of the two second piezoelectric vibrators are connected to the bottom of the base metal layer and are aligned with the first chamber and the second chamber, respectively.

According to an embodiment of the present invention, the micro blower further includes a drive circuit. The drive circuit is electrically connected to the first piezoelectric ceramic vibrators of the two first piezoelectric vibrators and the second piezoelectric ceramic vibrators of the two second piezoelectric vibrators, and is for providing a drive control power supply to cause each first piezoelectric ceramic vibrator and each second piezoelectric ceramic vibrator to vibrate along a vibration direction.

According to an embodiment of the present invention, when either of the first chamber and the second chamber receives vibration and contracts, the other receives the vibration and expands.

According to an embodiment of the present invention, heights of the first chamber and the second chamber are between 0.02 and 2 mm.

According to an embodiment of the present invention, the heat generating element is located outside the outlet channel.

According to an embodiment of the present invention, the heat generating element is located on a bottom of the second chamber.

DETAILED DESCRIPTION OF THE EMBODIMENTS

Preferred specific embodiments are given below to better understand the technical contents of the present invention.

Figure 1:
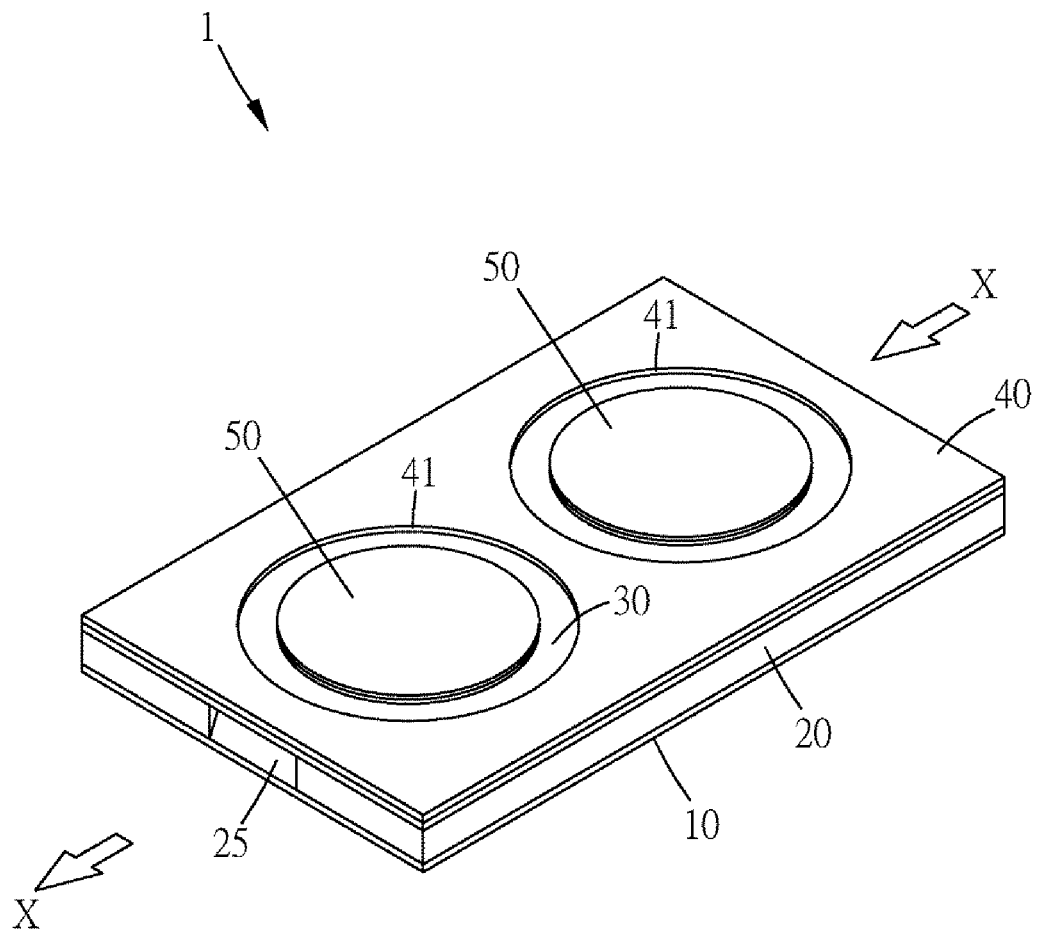
FIG. 1 is a schematic diagram of a micro blower according to a first embodiment of the present invention.
Figure 2:
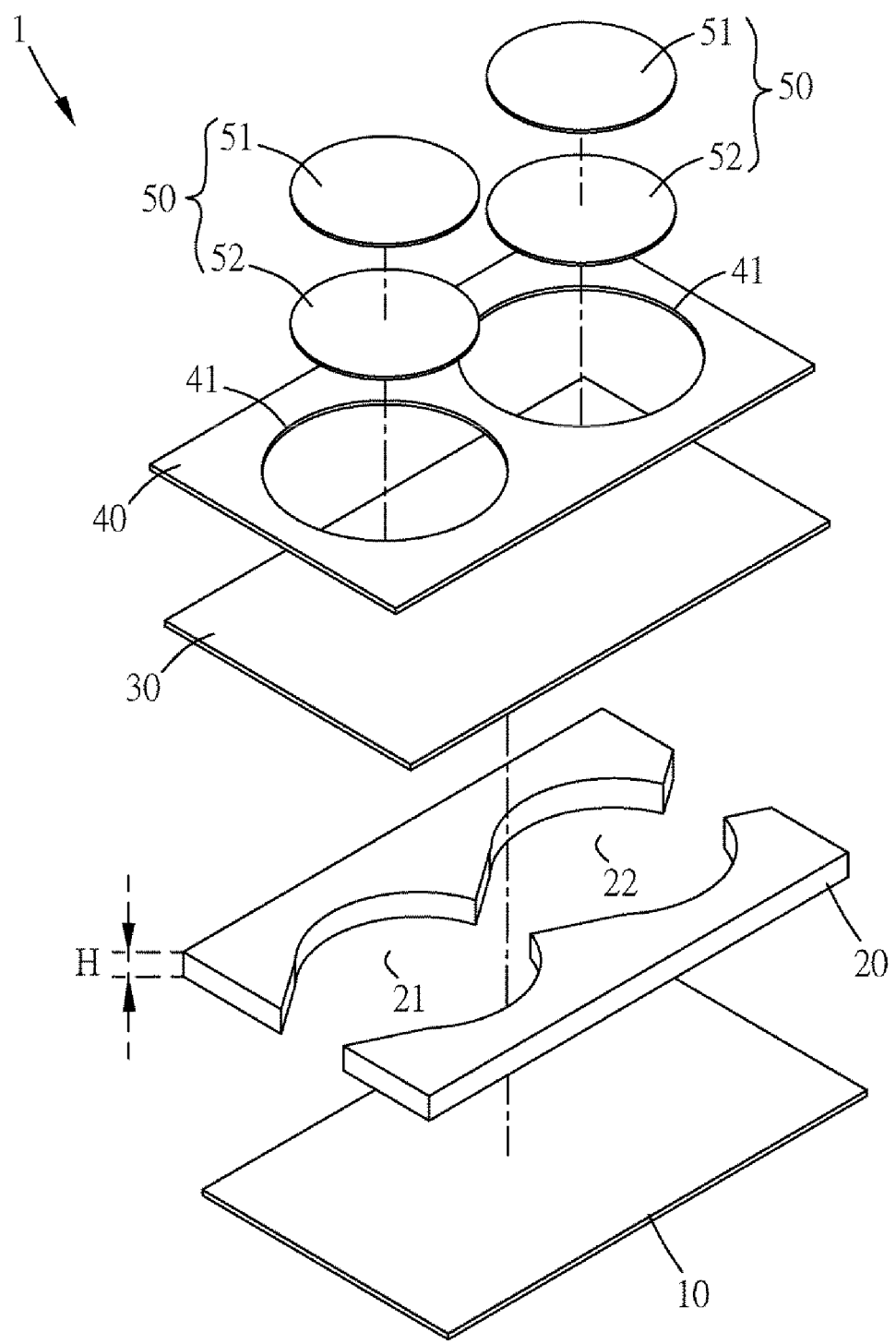
FIG. 2 is an exploded perspective diagram of the micro blower according to the first embodiment of the present invention.
Figure 3:
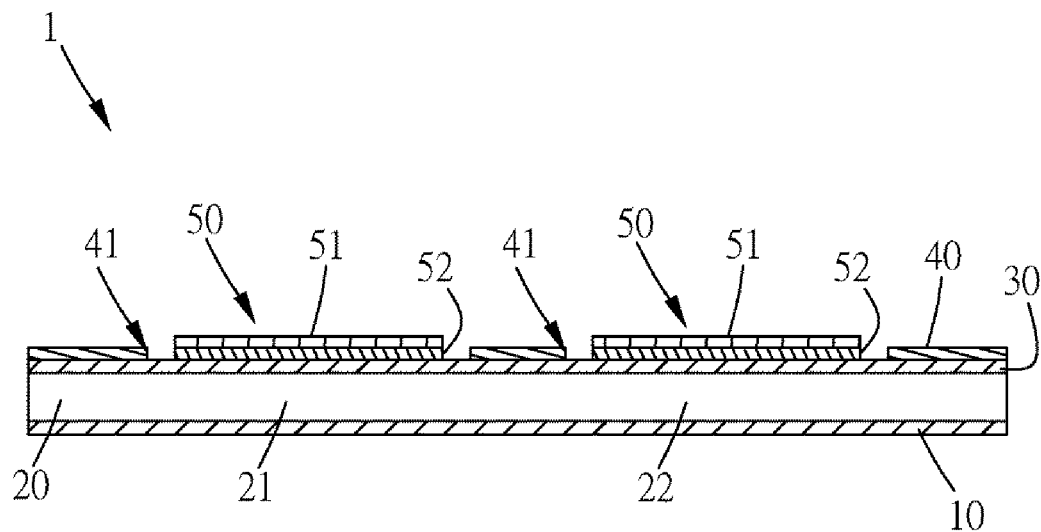
FIG. 3 is a section diagram of the micro blower according to the first embodiment of the present invention.
Figure 4:
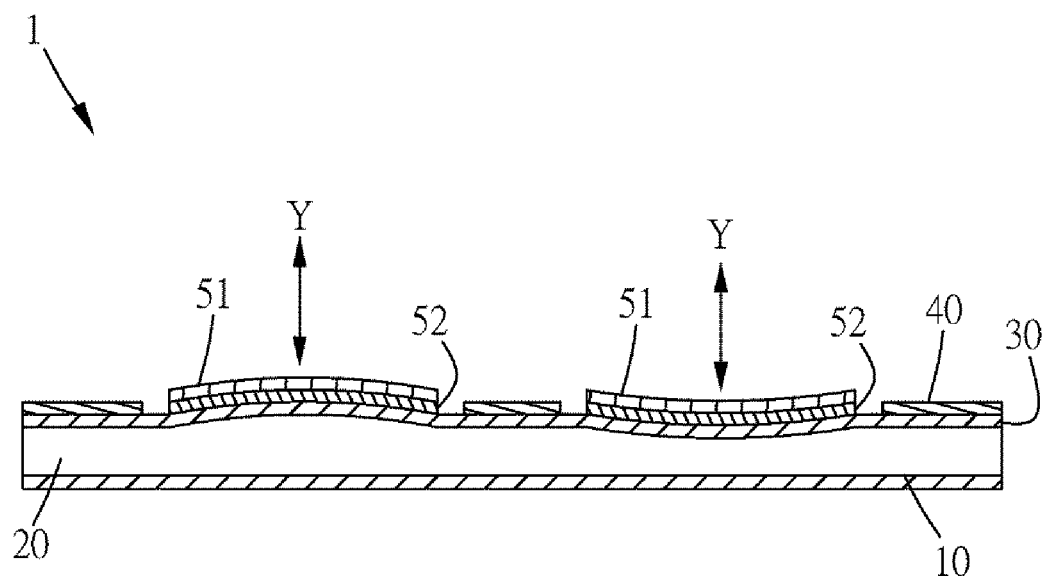
FIG. 4 is a section diagram of the micro blower when first piezoelectric vibrators vibrate according to the first embodiment of the present invention.
Figure 5:
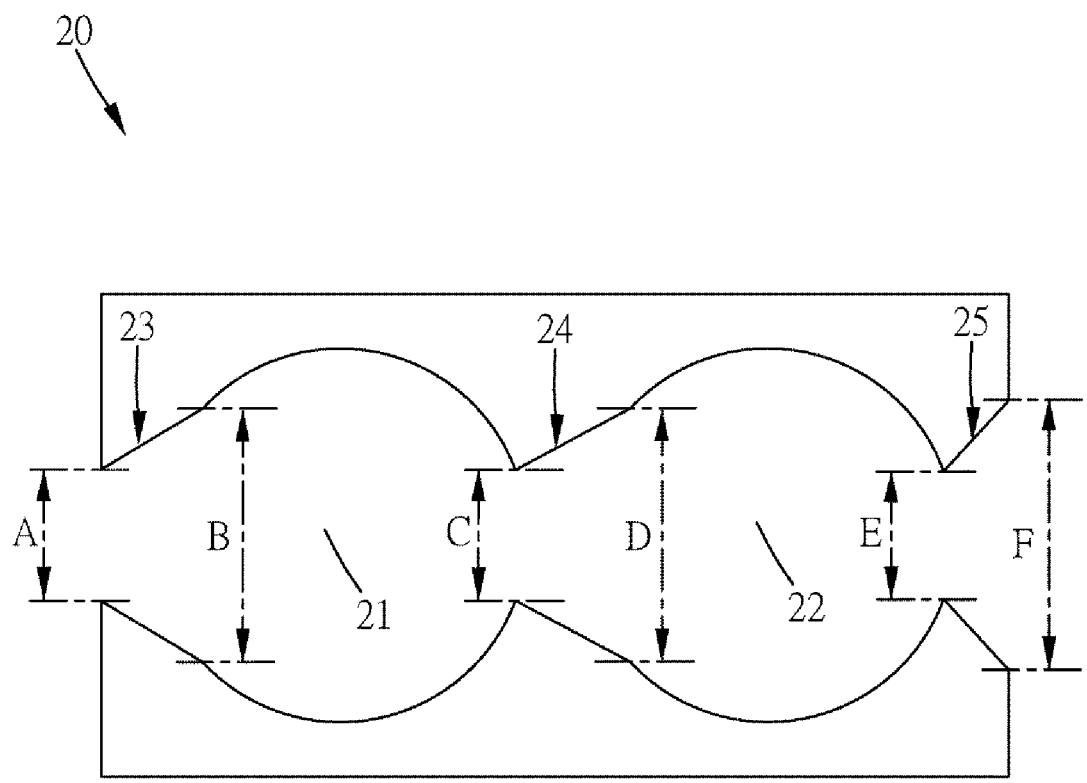
FIG. 5 is a schematic diagram a flowing channel layer according to the first embodiment of the present invention.
Figure 6:
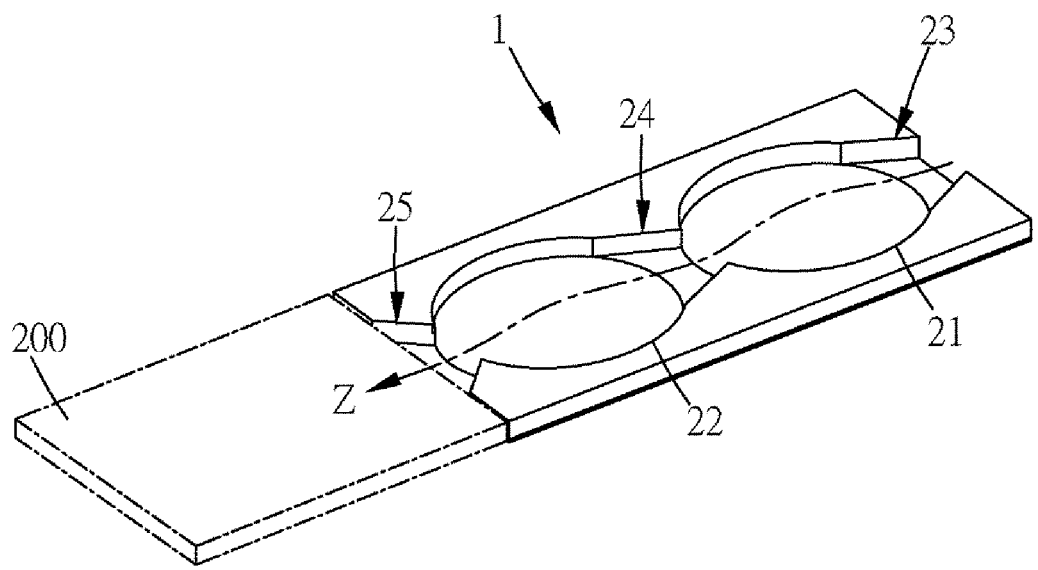
FIG. 6 is a schematic diagram an electronic element connected to an outlet channel of the micro blower according to the first embodiment of the present invention.
Figure 7:
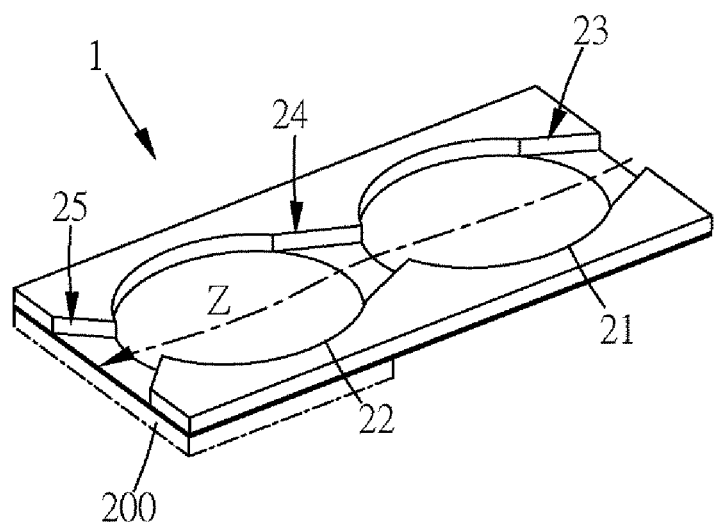
FIG. 7 is a schematic diagram an electronic element connected to a bottom of the micro blower according to the first embodiment of the present invention.
Figure 8:
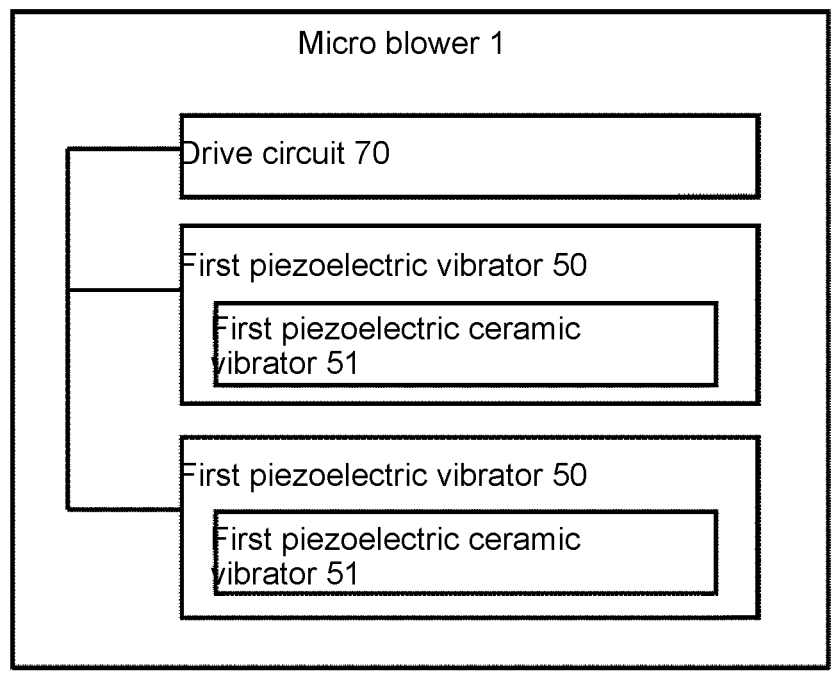
FIG. 8 is a system structural diagram of the micro blower according to the first embodiment of the present invention.

Refer to FIG. 1 to FIG. 8 for description associated with a micro blower according to a first embodiment of the present invention. FIG. 1 shows a schematic diagram of a micro blower according to a first embodiment of the present invention. FIG. 2 shows an exploded perspective diagram of the micro blower according to the first embodiment of the present invention. FIG. 3 shows a section diagram of the micro blower according to the first embodiment of the present invention. FIG. 4 shows a section diagram of the micro blower when first piezoelectric vibrators vibrate according to the first embodiment of the present invention. FIG. 5 shows a schematic diagram a flowing channel layer according to the first embodiment of the present invention. FIG. 6 shows a schematic diagram an electronic element connected to an outlet channel of the micro blower according to the first embodiment of the present invention. FIG. 7 shows a schematic diagram an electronic element connected to a bottom of the micro blower according to the first embodiment of the present invention. FIG. 8 shows a system structural diagram of the micro blower according to the first embodiment of the present invention.

As shown in FIG. 1 and FIG. 6 to FIG. 8, in a first embodiment of the present invention, in order to solve the problem of the level of heat generated by a portable electronic apparatus and to enhance heat dissipation efficiency, a micro blower 1 of the present invention may be mounted on an electronic element 200 (for example, a central processing unit that easily generates heat energy) of a portable electronic apparatus. With specially designed chambers and channels as well as a phase difference modal resonant vibrations of dual-chamber piezoelectric sheets, relative actions of expansion of one of the chambers and contraction of the other chamber are produced, such that interiors of the chambers present actions of a check valve to increase a volume of directional exhaust air, thereby generating a good blower cooling effect. The micro blower 1 includes a base metal layer 10, a flowing channel layer 20, a sandwich metal sheet 30, a capping layer 40, two first piezoelectric vibrators 50 and a drive circuit 70.

As shown in FIG. 2 and FIG. 5, in the first embodiment of the present invention, the base metal layer 10 is a sheet made of metal. The channel layer 20 is made of metal, and is connected to a top of the base metal layer 10. The flowing channel layer 20 is for forming a gas channel, which allows high-temperature air to flow to the exterior so as achieve a heat dissipation effect. The flowing channel layer 20 includes a first chamber 21, a second chamber 22, an inlet channel 23, a linking channel 24 and an outlet channel 25. Both of the first chamber 21 and the second chamber 22 are circular chambers. Heights H of the first chamber 21 and the second chamber 22 range between 0.02 and 2 mm. Thus, the micro blower 1 can be provided with a thinned overall height, and is extremely suitable to be mounted to a portable electronic apparatus.

The inlet channel 23 links to the first chamber 21 and includes an inlet channel inlet size A and an inlet channel outlet size B, wherein the inlet channel inlet size A is a size of one end facing the outside, and the inlet channel outlet size B is a size of one end facing the first chamber 21. The inlet channel inlet size A is smaller than the inlet channel outlet size B. The linking channel 24 links to the first chamber 21 and the second chamber 22 and includes a linking channel inlet size C and a linking channel outlet size D, wherein the linking channel inlet size C is a size of one end facing the first chamber 21, and the linking channel outlet size D is a size of one end facing the second chamber 21. The linking channel inlet size C is smaller than the linking channel outlet size D. The outlet channel 25 links to the second chamber 22 and includes an outlet channel inlet size E and an outlet channel outlet size F, wherein the outlet channel inlet size E is a size of one end facing the second chamber 22, and the outlet channel outlet size F is the size of one end facing the outside. The outlet channel inlet size E is smaller than the outlet channel outlet size F. A first ratio is present between the inlet channel outlet size B and the inlet channel inlet size A, a second ratio is present between the linking channel outlet size D and the linking channel inlet size C, and a third ratio is present between the outlet channel outlet size F and the outlet channel inlet size F. The first ratio, the second ratio and the third ratio may be designed to be the same or different. The first ratio, the second ratio and the third ratio all range between 1.5 and 2.0. It is discovered through actual experimentation of the applicant, using the ranges of the first ratio, the second ratio and the third ratio above, a maximum inlet suction amount and a maximum outlet exhaust amount can be obtained, thereby achieving a good heat dissipation effect.

In the first embodiment of the present invention, the sandwich metal sheet 30 is a sheet made of elastic phosphor bronze and is connected to a top of the flowing channel layer 20. The base metal layer 10 and the sandwich metal sheet 30 are bonded to the top and bottom surfaces of the flowing channel layer 20 to form effective chambers.

In the first embodiment of the present invention, the capping layer 40 is made of metal and is connected to and covers a top of the sandwich metal sheet 30. The capping layer 40 includes two accommodating regions 41. The two accommodating regions 41 are circular recesses and are located above the first chamber 21 and the second chamber 22, respectively.

As shown in FIG. 1 to FIG. 4 and FIG. 8, in the first embodiment of the present invention, areas and sizes of two first piezoelectric vibrators 50 correspond to a size and shape of the accommodating regions 41 of the capping layer 40. Moreover, a center of the circular first piezoelectric vibrator 50 is bonded on a top of the accommodating region 41 and is placed in a center thereof, and is bonded over the sandwich metal sheet 30. Each of the two first piezoelectric vibrators 50 includes a first piezoelectric ceramic vibrator 51 and a first linking sheet 52. The first piezoelectric ceramic vibrator 51 covers the first linking sheet 52. The first linking sheet 52 is bonded to the sandwich metal sheet 30 exposed from the accommodating region 41. When the first piezoelectric ceramic vibrators 51 of the two first piezoelectric vibrators 50 are driven by electrostriction, each first piezoelectric ceramic vibrator 51 vibrates along a vibration direction Y, and drives the first linking sheet 52 to compress or stretch the sandwich metal sheet 30, such that the sandwich metal sheet 30 generates an agitation effect of modal resonance along the vibration direction Y and generates a deformation effect of maximum agitation displacement by a size ratio of the sandwich metal sheet 30 and the accommodating regions 41, further changing the volumes of the first chamber 21 and the second chamber 22 to thereby generate an air flow.

The drive circuit 70 may be a control chip or wireless controller arranged in an external computer and is electrically connected to the first piezoelectric ceramic vibrators 51 of the two first piezoelectric vibrators 50 and an external computer (not shown). The drive circuit 70 is for receiving control of the external computer so as to provide a drive control power supply to the two first piezoelectric vibrators 50, for the first piezoelectric ceramic vibrators 51 of the two first piezoelectric vibrators 50 to vibrate at an ultrasonic resonant frequency along the vibration direction Y. The vibration direction Y of the first piezoelectric ceramic vibrators 51 of the two first piezoelectric vibrators 50 and the inlet channel 23 are perpendicular to each other. When either of the first piezoelectric vibrators 50 vibrates, the first piezoelectric vibrator 50 also drives the sandwich metal sheet 30 to agitate in a single-reed manner, so as to drive the first chamber 21 and the second chamber 22 to expand or compress. When either of the first chamber 21 and the second chamber 22 receives vibration and hence contracts, the other receives the vibration and hence expands.

As shown in FIG. 1 and FIG. 6 to FIG. 8, when a user to use the micro blower 1 to cool the electronic element 200, the user may first connect the electronic element 200 on the outside of the outlet channel 25, so as to facilitate exhaustion of the outlet channel 25 to cool the electronic element 200. Alternatively, the electronic element 200 may also be connected to the bottom of the second chamber 22, so as to facilitate heat energy of the electronic element 200 to be transferred to an interior of the micro blower 1 by means of thermal conduction, allowing air flow flowing at the interior of the micro blower 1 to take away the heat energy of the electronic element 200. Next, the user may use an external computer to operate the drive circuit 70 for the drive circuit 70 to provide a drive control power supply to the first piezoelectric ceramic vibrators 51 of the two piezoelectric vibrators 50, such that the first piezoelectric ceramic vibrators 51 of the two piezoelectric vibrators 50 vibrate at an ultrasonic frequency along the vibration direction Y. The two first piezoelectric vibrators 50 that vibrate at an ultrasonic resonant frequency generate fast changes in deformation, and cause the two chambers to generate an effective blower effect by expansion of one of the chambers and contraction of the other chamber resulted from a phase difference control thereof. Thus, the volumes of the first chamber 21 and the second chamber 22 are changed to thereby generate an air flow, which flows along an air flow direction Z.

While the first piezoelectric vibrator 50 drives the two piezoelectric sheets such that the volumes of the first chamber 21 and the second chamber 22 are compressed, due to the gradually decreasing design of the channel openings, when cold air is drawn into the first chamber 21 that expands and squeezed out from a smallest outlet end of the second chamber 22 that compresses, cold air becomes hot air due to thermal exchange in the chambers. When the end of the first chamber 21 is compressed and squeezed, the second chamber 22 at this point expands and draws in air, such that the hot air in the two chambers is forced to flow uni-directionally along the air flow direction Z, hence achieving an efficient blower effect. With the blower effect, air can be drawn from the inlet channel 23 to the first chamber 21 and the second chamber 22. Next, with valve openings of the first chamber 21 and the second chamber 22 and by means of operating the first piezoelectric vibrators 50 on the tops of the first chamber 21 and the second chamber 22 to generate phase differences in amplitude and vibration, air in the chambers is compressed and then blown out from the outlet channel 25. As such, the chambers are compressed and stretched by using the first piezoelectric vibrators 50 to drive air to flow, and the ranges of the first ratio, the second ratio and the third ratio can be designed such that a maximum inlet suction amount and a maximum outlet exhaust amount can be obtained, thereby providing the electronic element 200 with a good heat dissipating effect.

Figure 9:
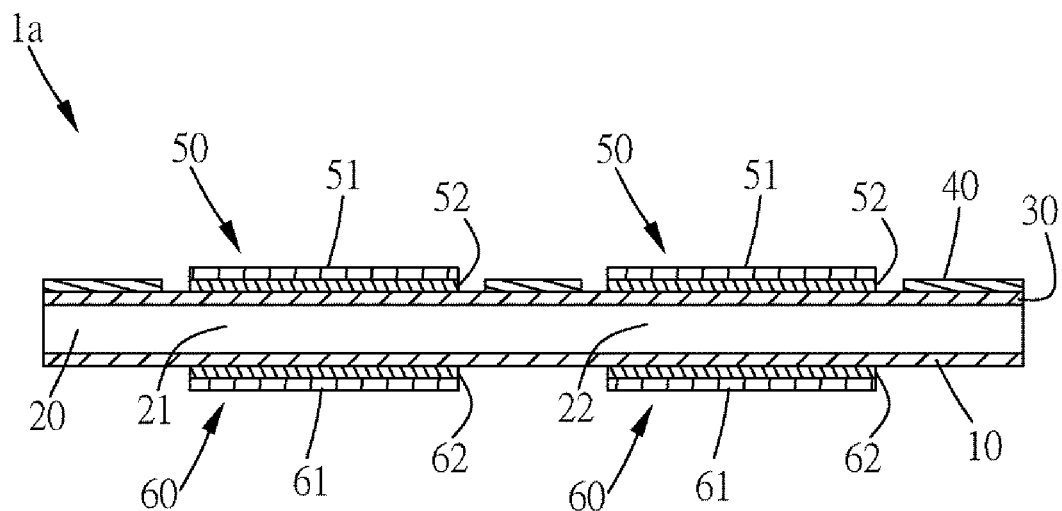
FIG. 9 is a section diagram of a micro blower according to a second embodiment of the present invention.
Figure 10:
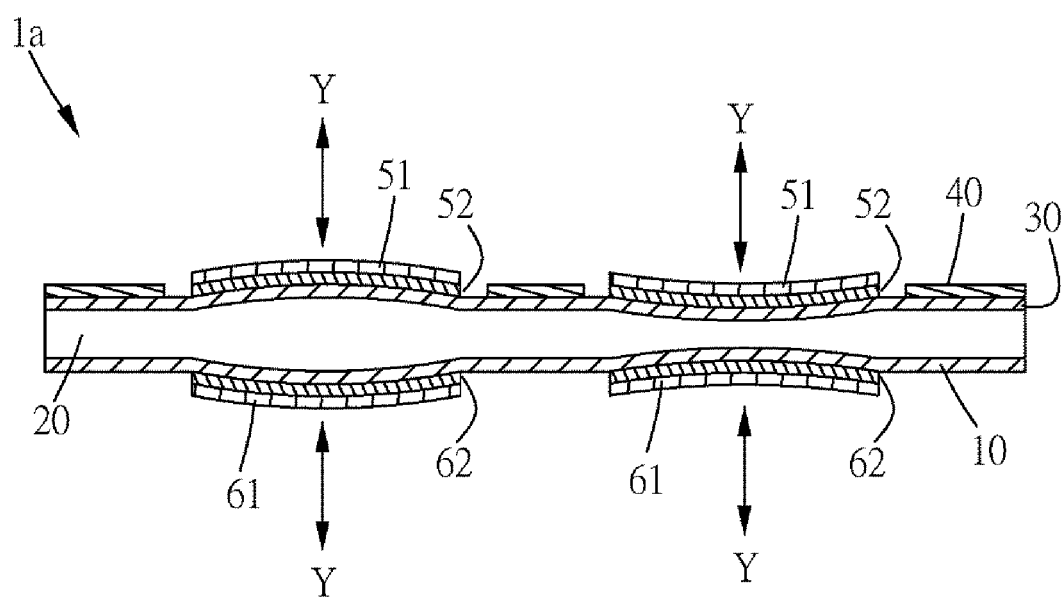
FIG. 10 is a section diagram of the micro blower when first piezoelectric vibrators and second piezoelectric vibrators vibrate according to the second embodiment of the present invention.
Figure 11:
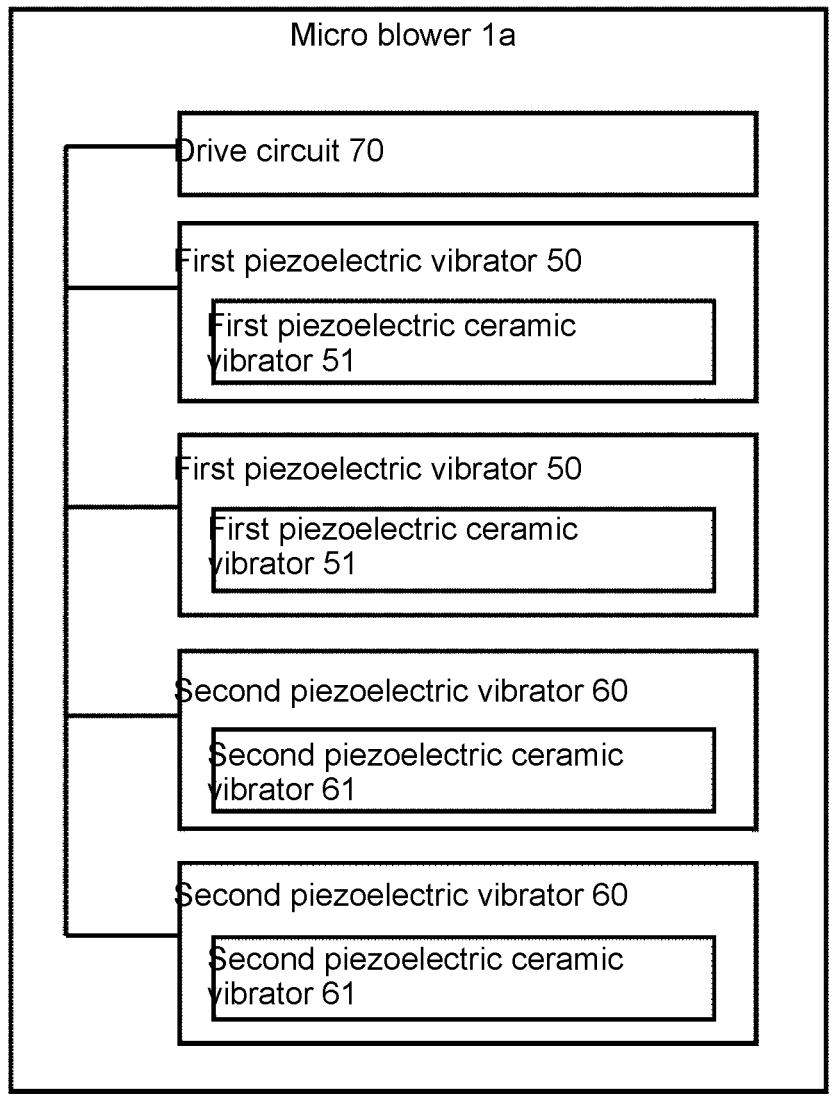
FIG. 11 is a system structural diagram of the micro blower according to the second embodiment of the present invention.

Refer to FIG. 9 to FIG. 11 for description associated with a micro blower according to a second embodiment of the present invention. FIG. 9 shows a section diagram of a micro blower according to a second embodiment of the present invention. FIG. 10 shows a section diagram of the micro blower when first piezoelectric vibrators and second piezoelectric vibrators vibrate according to the second embodiment of the present invention. FIG. 11 shows a system structural diagram of the micro blower according to the second embodiment of the present invention.

As shown in FIG. 9 to FIG. 11, the second embodiment differs from the first embodiment in that, in the second embodiment, a micro blower 1a further includes two second piezoelectric vibrators 60. The second piezoelectric vibrators 60 are connected to the bottom of the base metal layer 10 and are aligned with the first chamber 21 and the second chamber 22, respectively. Each of the two second piezoelectric vibrators 60 includes a second piezoelectric ceramic vibrator 61 and a second linking sheet 62. The second piezoelectric ceramic vibrator 61 covers the second linking sheet 62. The two second linking sheets 62 of the two second piezoelectric vibrators 60 are connected to the bottom of the base metal layer 10 and are aligned with the first chamber 21 and the second chamber 22, respectively.

The drive circuit 70 is electrically connected to the first piezoelectric ceramic vibrators 51 of the two first piezoelectric vibrators 50 and the second piezoelectric ceramic vibrators 61 of the two second piezoelectric vibrators 60. The drive circuit 70 is for providing a drive control power supply for the each of two first piezoelectric vibrators 50 and each of the two second piezoelectric vibrators 60 to vibrate at an ultrasonic resonant frequency along the vibration direction Y. The vibration direction Y of the second piezoelectric ceramic vibrators 61 of the two second piezoelectric vibrators 60 and the inlet channel 23 are perpendicular to each other. When the second piezoelectric ceramic vibrators 61 are driven by electrostriction, the second linking sheet 62 are driven to compress or stretch the base metal layer 10, such that the base metal layer 10 generates an agitation effect of modal resonance along the vibration direction Y and generates a deformation effect of maximum agitation displacement by the base metal layer 10.

The micro blower of the present invention with the design above can be mounted on an electronic element of a portable electronic apparatus. With a specially designed dual-chamber channels and channel sizes as well the dual chambers and a vibration difference of the piezoelectric vibrators adhered to the sandwich metal sheet, the interiors of the chambers present actions of a check valve to increase the volume of exhaust air, thereby enhancing the amount of cooling. The electronic element may be mounted on the outside of the second chamber of the micro blower or be aligned with the outlet channel according to application requirements, so as to dissipate heat by means of thermal conduction or blowing.

It should be noted that, the embodiments given above are examples of the present invention rather than limitations to the present invention. Any variation without departing from the fundamental structure of the invention is to be encompassed within the scope of protection in accordance with the broadest interpretation of the appended claims of the application.

What is claimed is:

1. A micro blower, applied to a heat generating element, the micro blower comprising:
   a base metal layer;
   a flowing channel layer, connected to a top of the base metal layer, the flowing channel layer comprising:
   a first chamber;
   a second chamber;
   an inlet channel, linking to the first chamber and comprising an inlet channel inlet size and an inlet channel outlet size, the inlet channel inlet size being smaller than the inlet channel outlet size;
   a linking channel, linking to the first chamber and the second chamber and comprising a linking channel inlet size and a linking channel outlet size, the linking channel inlet size being smaller than the linking channel outlet size; and
   an outlet channel, linking to the second chamber and comprising an outlet channel inlet size and an outlet channel outlet size, the outlet channel inlet size being smaller than the outlet channel outlet size;
   a sandwich metal sheet, connected to a top of the flowing channel layer;
   a capping layer, connected to a top of the sandwich metal sheet and comprising two accommodating regions, the two accommodating regions located above the first chamber and the second chamber, respectively; and
   two first piezoelectric vibrators, located on tops and placed in centers of the two accommodating regions, respectively, and bonded on the top of the sandwich metal sheet, wherein each of the two first piezoelectric vibrators vibrates along a vibration direction when the two piezoelectric vibrators are driven, so as to change volumes of the first chamber and the second chamber to thereby generate an air flow.

2. The micro blower according to claim 1, wherein a first ratio is present between the inlet channel outlet size and the inlet channel inlet size and ranges between 1.5 and 2.0.

3. The micro blower according to claim 1, wherein a second ratio is present between the linking channel outlet size and the linking channel inlet size and ranges between 1.5 and 2.0.

4. The micro blower according to claim 1, wherein a third ratio is present between the outlet channel outlet size and the outlet channel inlet size and ranges between 1.5 and 2.0.

5. The micro blower according to claim 1, wherein each of the two first piezoelectric vibrators comprises a first piezoelectric ceramic vibrator and a first linking sheet, the first piezoelectric ceramic vibrator covers the first linking sheet, and the first linking sheet is bonded to the sandwich metal sheet exposed from the accommodating region.

6. The micro blower according to claim 1, further comprising two second piezoelectric vibrators, wherein the two second piezoelectric vibrators are connected to a bottom of the base metal layer and are aligned with the first chamber and the second chamber, respectively.

7. The micro blower according to claim 6, wherein each of the two second piezoelectric vibrators comprises a second piezoelectric ceramic vibrator and a second linking sheet, the second piezoelectric ceramic vibrator covers the second linking sheet, and the second linking sheets of the two second piezoelectric vibrators are bonded to the bottom of the sandwich metal sheet and are aligned with the first chamber and the second chamber, respectively.

8. The micro blower according to claim 7, further comprising:
   a drive circuit, electrically connected to the first piezoelectric ceramic vibrators of the two first piezoelectric vibrators and the second piezoelectric ceramic vibrators of the two second piezoelectric vibrators, the drive circuit for providing a drive control power supply to cause each first piezoelectric ceramic vibrator and each second piezoelectric ceramic vibrator to vibrate along the vibration direction.

9. The micro blower according to claim 1, wherein when either of the first chamber and the second chamber receives vibration and contracts, the other receives vibration and expands.

10. The micro blower according to claim 1, wherein heights of the first chamber and the second chamber are between 0.02 and 2 mm.

11. The micro blower according to claim 1, wherein the heat generating element is located on an outside of the outlet channel.

12. The micro blower according to claim 1, wherein the heat generating element is located on a bottom of the second chamber.

* * * * *